United States Patent [19]

Hayakawa

[11] Patent Number: 4,722,027
[45] Date of Patent: Jan. 26, 1988

[54] HYBRID CIRCUIT DEVICE

[75] Inventor: Yasumitsu Hayakawa, Saitama, Japan

[73] Assignee: Toko Inc., Tokyo, Japan

[21] Appl. No.: 893,141

[22] Filed: Aug. 5, 1986

[30] Foreign Application Priority Data

| Aug. 9, 1985 | [JP] | Japan | 60-123057[U] |
| Aug. 21, 1985 | [JP] | Japan | 60-127409[U] |
| Aug. 21, 1985 | [JP] | Japan | 60-127410[U] |
| Aug. 27, 1985 | [JP] | Japan | 60-130647[U] |

[51] Int. Cl.$^4$ .............................................. H03H 7/32
[52] U.S. Cl. .............................. 361/400; 174/52 FP; 174/52 PE; 333/140
[58] Field of Search ............... 361/380, 395, 399, 400, 361/401, 404, 405; 339/17 CF; 174/52 FP, 52 PE; 357/72, 74, 80; 333/138, 140; 439/68, 70, 72, 74

[56] References Cited

U.S. PATENT DOCUMENTS

| 3,287,795 | 11/1966 | Chambers | 361/401 |
| 4,144,555 | 3/1979 | McGalliard | 361/401 |
| 4,249,229 | 2/1981 | Hester | 361/400 |
| 4,372,037 | 2/1983 | Scapple | 361/400 |
| 4,455,538 | 6/1984 | Kinzler | 174/52 PE |
| 4,489,487 | 12/1984 | Bura | 361/400 |
| 4,506,238 | 3/1985 | Endoh | 333/140 |
| 4,628,148 | 12/1986 | Endou | 174/52 PE |

Primary Examiner—G. P. Tolin

[57] ABSTRACT

In a hybrid circuit device comprising a base plate on which a circuit including coils is provided, and a flat package of integrated circuit having a smaller flat area than that of the base plate, the flat package and base plate are superimposed upon each other; the two circuits are connected together through terminals of the flat package; external terminals are connected to at least one of the two circuits; the hybrid circuit device is encapsulated with plastics as a whole, with the external terminals being exposed through the encapsulation; and on that part of the base plate which does not overlap the flat package, circuit components constituting the circuit provided on the base plate are securely mounted at lateral positions with respect to the flat package.

2 Claims, 7 Drawing Figures

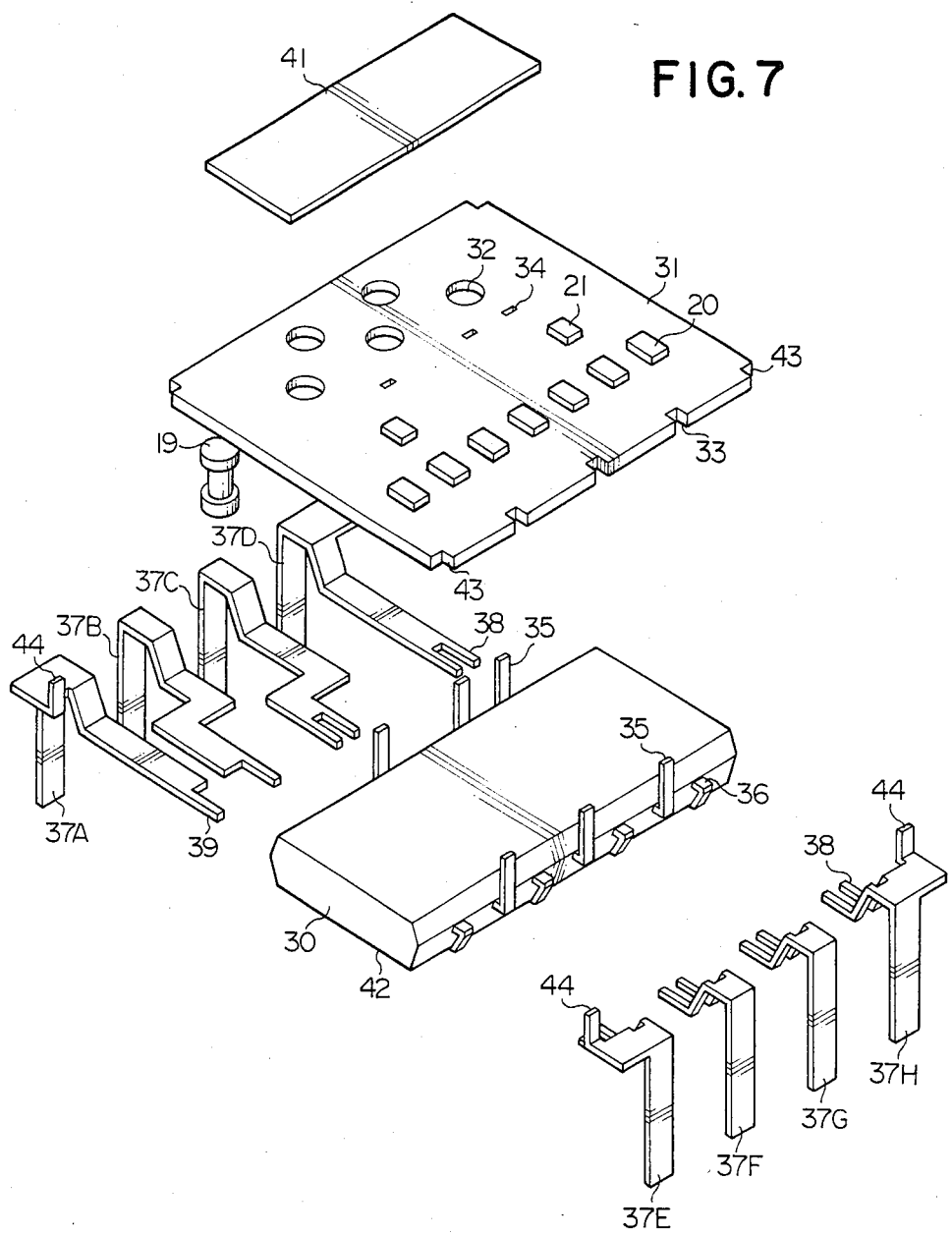

HYBRID CIRCUIT DEVICE

BACKGROUND OF THE INVENTION

1. Field of the Invention

This invention relates to a hybrid circuit device wherein a base plate having any desired form of circuit provided thereon is externally connected to an integrated circuit, and more particularly it pertains to construction adapted to reduce the thickness of such device.

2. Description of the Prior Art

Presently, most electronic circuits have been provided in the form of an integrated circuit. However, difficulties have been experienced in fabricating, in the form of an integrated circuit, an inductance containing circuit such as a delay line circuit which consists of a combination of coils and capacitors, for example. Thus, in the case of a circuit device including a circuit which is difficult to provide in the form of an integrated circuit, it is required that such a circuit be externally connected to the integrated circuit. Such requirement arises when it is attempted to provide a buffered delay line by combining a delay line with a saturation type logical circuit using TTL elements, for example. U.S. Pat. No. 4,506,238, for example, discloses a hybrid circuit device wherein a base plate supporting a delay line circuit comprising coils and capacitors, is superimposed upon flat package of an integrated circuit; the two circuits are connected together through terminals of the flat package; and external terminals are exposed through the dual in-line package (referred to as DIP hereinafter).

In such a conventional hybrid circuit device, however, the coils 1 and capacitors 2 are all mounted on the base plate 3, i.e., on the side opposite to the flat package 4, as shown in FIG. 5. The base plate 3 and flat package 4 are substantially equal in width to each other, and the two circuits are connected together through upwardly-bent terminals 5 of the flat package 4 at side face of the base plate 3. Also at side face of the base plate 3, external terminals 7 are connected to terminals 6 projecting out of side face of the flat package 4. In this way, it is required that all the connections between the external terminals 7 and the terminals 6, between the base plate 3 and the external terminals 7 and between the base plate 3 and the terminals 5 be provided adjacent to side face of the base plate 3, thus, the connecting structure turns out to be complicated so that short-circuiting is liable to occur. Difficulties are encountered in an attempt to mount circuit components at the side of the flat package 4 where the complicated connecting structure is provided, and hence during the assembling procedures, the flat package 4, base plate 3 and circuit components constituting the delay line are superimposed upon each other. Obviously, with such an arrangement, it is difficult to reduce the thickness T of the DIP shown by the alternate long and short dash lines in FIG. 5. In the case where such hybrid circuit device is mounted onto another circuit board, together with other circuit components, the thickness T of the DIP will be greater than the thickness of any of the other circuit components, and this is undesirable from the standpoint of making flat the circuit board as a whole.

SUMMARY OF THE INVENTION

It is an object of the present invention to provide a hybrid circuit device which is designed so that circuit components mounted on a base plate are located at the side of a flat package, i.e., at lateral positions with respect to the flat package, so that the device is provided in a flat form.

Another object of the present invention is to provide a hybrid circuit device which is so designed as to eliminate the possibility that the base plate of the device is inclined and/or the connected portions are broken when the hybrid circuit device is encapsulated with plastics.

Briefly stated, according to the present invention, there is provided a hybrid circuit device comprising a base plate on which a circuit including coils is provided, and a flat package of an integrated circuit having a smaller flat area than that of the base plate, wherein said base plate and said flat package are superimposed upon each other; the two circuits are connected together through terminals of the flat package; external terminals are connected to at least one of said two circuits; the hybrid circuit device is encapsulated with plastics as a whole, with the external terminals being exposed through the encapsulation; and on that part of the base plate which does not overlap the flat package, circuit components constituting the circuit provided on the base plate are securely mounted at lateral positions with respect to the flat package.

Other objects, features and advantages of the present invention will become apparent from the ensuing description taken in conjunction with the accompanying drawings.

BRIEF DESCRIPTION OF THE DRAWINGS

FIG. 7 is an exploded perspective view of the hybrid circuit device shown in FIG. 6.

DESCRIPTION OF THE PREFERRED EMBODIMENTS

Figure 1:
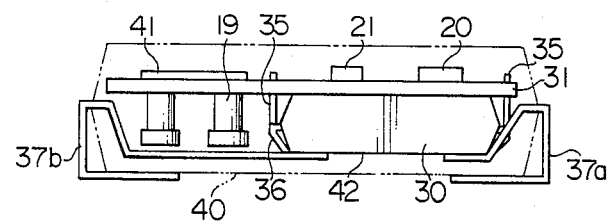
FIG. 1 is a schematic side view of the hybrid circuit device according to an embodiment of the present invention.
Figure 2:
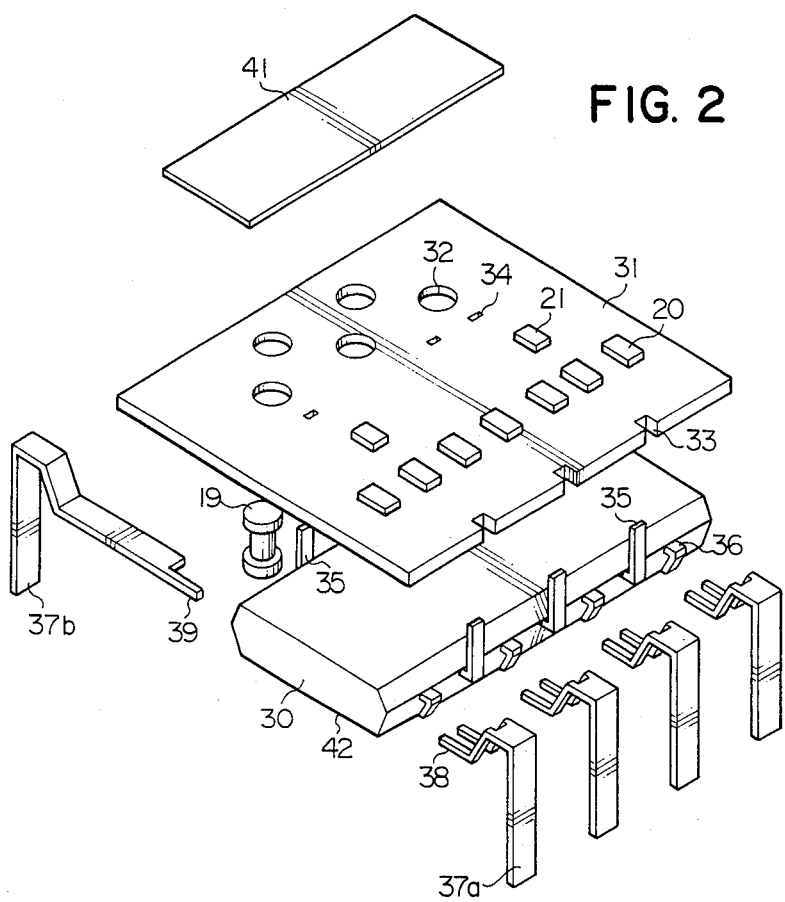
FIG. 2 is an exploded perspective view of the hybrid circuit device shown in FIG. 1.
Figure 3:
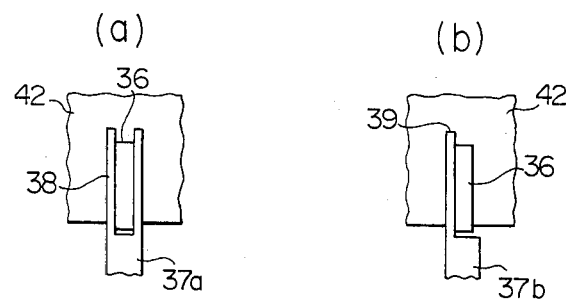
FIG. 3(a) and 3(b) are plan views showing structures for connecting external terminals to terminals of a flat package.

Description will be made of the buffered delay line shown in FIG. 4, with reference to FIGS. 1 to 3 showing the hybrid circuit device according to a first embodiment of the present invention.

Figure 4:
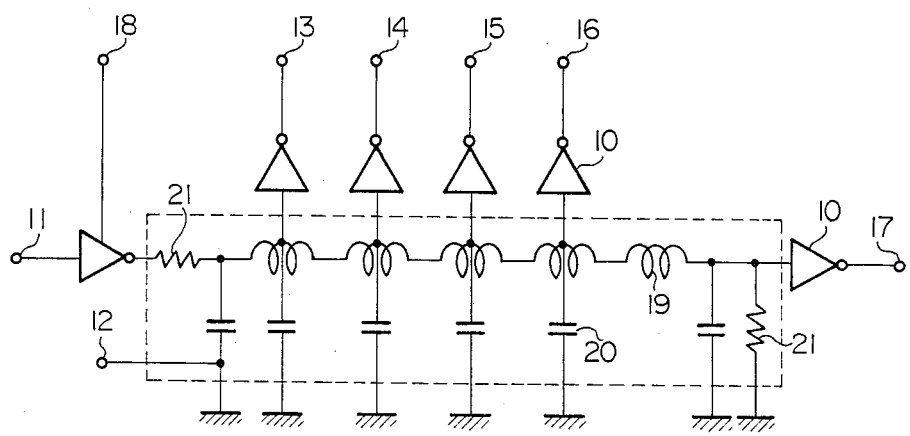
FIG. 4 is a circuit diagram showing a buffered delay line.
Figure 5:
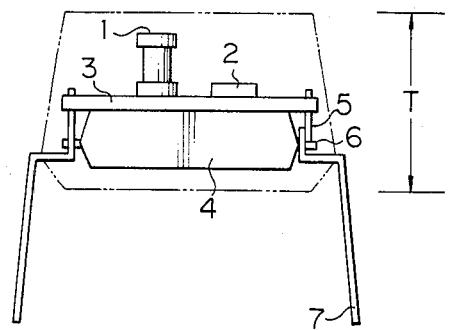
FIG. 5 is a view showing a conventional hybrid circuit device.

In FIG. 4, TTL elements are indicated at 10, an input terminal at 11, a ground terminal at 12, output terminals at 13 to 17, a power supply terminal at 18, coils at 19, capacitors at 20, and resistors at 21. Six TTL elements 10 are provided inside flat package 30 of integrated circuit shown in FIGS. 1 and 2, and the delay line shown as being surrounded by a dotted line is provided on a base plate 31.

The base plate 31 is formed with through-apertures 32 and 34 and also with grooves at side face thereof. Upwardly-bent terminals 35 of the flat package 30 are fitted, from below, in the apertures 34 and grooves 33, and the base plate 31 and flat package 30 are superimposed upon each other. As will be appreciated, the flat area of the base plate 31 is made to be greater than that of the flat package 30, primarily by making the width of the base plate 31 greater than that of the flat package 30. The apertures 32 are adapted so that the coils 19 can be fitted therein. More specifically, each aperture 32 is configured in the form of a circle having a diameter substantially equal to that of the flange of drum core of each coil 19 which comprises a winding wound on the drum core, so that the coils 19 can be fitted in the aperture 32 in an upstanding form. The apertures 32 are formed in that portion of the base plate 31 which does not overlap the flat package 30, so that the coils 19 fitted in the apertures 32 from below are disposed side by side with the flat package 30, i.e., at lateral position with respect to the flat package 30. The coils 19 are disposed in engagement with the adhesive face of an adhesive tape 41 applied, from above, onto the base plate 31 in such a manner as to cover the apertures 32.

FIG. 2 shows the manner in which the circuit components contained in the portion enclosed with the dotted line in FIG. 4 are mounted onto the base plate 31. Although not shown, conductor patterns are provided around the apertures 34 and grooves 33 for the purposes of connecting the above-mentioned circuit components together and connecting the integrated circuit to the circuit provided on the base plate 31. The flat package 30 is of 14-pin type having seven terminals exposed at each of the opposite sides, wherein except for the upwardly-bent terminals 35 to be connected to the circuit provided on the base plate 31, the terminals 36 are so bent as to extend along the outer surface of the flat package as far as the outer face 42 opposite to the base plate 31. The terminals 36 are connected to the external terminals 37a and 37b at the outer face 42. The external terminals 37a has a forked end portion 38, and the other external terminals 37b has an elongated end portion 39, as shown in FIG. 2. At the outer face 42 of the flat package 30, the forked end portions 38 of the external terminals 37a are soldered to the terminals 36 with the latters being held between the two fingers thereof, as shown in FIG. 3(a), and the elongated end portions 39 of the external terminals 37b are so disposed as to extend along and in contact with the terminals 36 and soldered thereto. With such an arrangement, it will be appreciated that soldering areas are increased so that soldering can be effected with an enhanced reliability. The elongate configuration of the end portion 39 of each external terminal 37b serves to prevent occurrence of short-circuiting accident which would otherwise tend to be caused when the external terminals 37b are permitted to approach the terminals 36 of the flat package which are all downwardly bent, instead of being bent alternately upwardly and downwardly, as shown in FIG. 2.

The upwardly-bent terminals 35 are soldered to the conductor patterns provided around the apertures 34 and grooves 33. These six terminals 35 correspond to the input terminals of the TTL elements 10 connected to the five output terminals 13 to 17 in FIG. 4, and the output terminals of the TTL elements 10 connected to the input terminal 11. The eight downwardly-bent terminals 36 correspond to the output terminals 13 to 17, input terminal 11, power supply terminal 18, and ground terminal 12, respectively. The resulting composite structure is encapsulated with plastics as a whole, as shown by the alternate long and short dash lines in FIG. 1 and the internal circuit is led out of the DIP through the external terminals 37a and 37b.

The external terminals 37a and 37b are so bent as to extend along the outer surface of the DIP as far as the bottom face 40 thereof and are adapted, when mounted onto another circuit board with other circuit components, to be directly surface-connected to conductor patterns of the circuit board. In the illustrated embodiment, it is possible that the positional relationship between the base plate 31 and the flat package 30 may be reversed, i.e., the base plate 31 may be disposed under the flat package 30 in so far as the circuit components can be disposed at lateral positions with respect to the flat package. It is to be understood that the "lateral positions" referred to above include not only positions width-wise of the flat package 30 but also positions longitudinal thereof. It is also possible that instead of the apertures 32, holes which are closed at the bottom ends, may be provided so that the circuit components may be securely fixed therein with a bonding agent. In the case where the circuit components disposed at lateral positions with respect to the flat package 30 are smaller in height than the thickness of the flat package 30, it is not always required that the apertures be provided, but by utilizing such apertures, the circuit components can more easily be located and fixed in position. Furthermore, although in the illustrated embodiment, all the external terminals 37a and 37b were connected to the terminals 36 of the flat package 30, it is also possible that some of the external terminals may be led out of side face of the base plate 31. In such a case, the grooves 33 are conveniently formed at the side opposite to said side face of the base plate 31.

Figure 6:
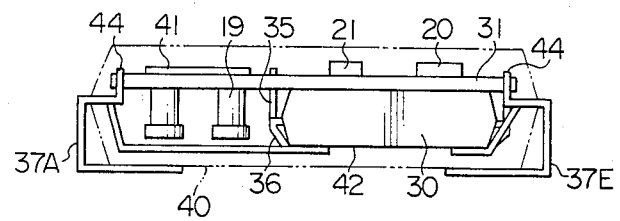
FIG. 6 is a schematic side view of the hybrid circuit device according to another embodiment of the present invention.

Referring to FIGS. 6 and 7, there is shown the hybrid circuit device according to a second embodiment of the present invention. In this embodiment, too, the circuit arrangement of the hybrid circuit may be one which constitutes such a buffered delay line as shown in FIG. 4. In FIGS. 6 and 7, parts similar to those of FIGS. 1 to 3 are indicated by like reference numerals.

Base plate 31 is formed with through-apertures 32 and 34, and also with grooves 33 at side face thereof. Furthermore, the base plate 31 is also formed with notches 43 at the four corners thereof. Upwardly-bent terminals 35 of a flat package 30, which has a smaller flat area than the base plate 31, are inserted, from below, in the apertures 34 and grooves 33, so that the base plate 31 and flat package 30 are superimposed upon each other. The apertures 32, in which coils 19 are to be inserted, are formed in that portion of the base plate 31 which does not overlap the flat package 30. The coils 19, which are fitted in the apertures 32 from below, are located at lateral positions with respect to the flat package 30, and securely attached to the adhesive face of an adhesive tape 41 placed on the plate 31 in such a manner as to cover the apertures 32. FIG. 7 shows the manner in which the circuit components contained in the portion enclosed with the dotted line in FIG. 4 are mounted onto the base plate 31. Although not shown, conductor patterns are provided around the apertures 34 and grooves 33 for the purposes of connecting the integrated circuit to the circuit provided on the base plate 31, as in FIG. 2.

The flat package 30 is of 14-pin type having seven terminals exposed at each of the opposite sides thereof, wherein except for the upwardly-bent terminals 35 to be connected to the circuit provided on the base plate 31, the terminals 36 are so bent as to extend along the outer surface of the flat package as far as the outer face 42 opposite to the base plate 31. The terminals 36 are connected to external terminals 37A to 37H at the outer face 42. There are two different configurations of the end portions of the external terminals to connected to the terminals 36, as in the first-mentioned embodiment of the present invention. The elongate configuration of the end portion 39 serves to prevent occurrence of short-circuiting accident which would otherwise tend to be caused when external terminals, 37A and 37B for example, are connected to adjacent ones of the terminals 36.

Of the eight external terminals, each of the external terminals 37A, 37D, 37E and 37H to be disposed at the extremities, is provided with an upwardly bent portion 44. These bent portions 44 are fitted and secured in recesses 43 of the base plate 31 respectively. Although not shown, separate conductor patterns, which are not connected to the conductor patterns of the circuit, are provided around the recesses 43. The bent portions 44 are soldered to such separate conductor patterns. That is, the external terminals provided at the extremities are connected at one end to the terminals 36 of the flat package 30 and the bent portions 44 are securely attached to the four corners of the base plate 31. Each of the external terminals 37B and 37C has a horizontal portion bent in a crank-like shape, which serves to make uniform the spacing between the external terminals.

The upwardly-bent terminals 35 of the flat package 30 are soldered to the conductor patterns provided around the apertures 34 and grooves 33. The six terminals 35 correspond to the input terminals of the TTL elements connected to the five output terminals 13 to 17 in FIG. 4, and the output terminal of the TTL element connected to the input terminal 11, respectively. The eight downwardly-bent terminals 36 correspond to the output terminals 13 to 17, input terminal 11, power supply terminal 18 and ground terminal 12, respectively. The composite structure is encapsulated as a whole with plastics as shown by the alternate long and short dash lines in FIG. 6. The internal circuit is led out of the DIP through the external terminals connected to the terminals 36.

The external terminals 37A to 37H are so bent as to extend along the outer surface of the DIP as far as the outer face 40 thereof and are adapted, when mounted onto another circuit board with other circuit components, to be directly surface-connected to conductor patterns of the circuit board. Positioning the one end of the external terminals at the extremities is facilitated by the notches 44 provided at the four corners, but such notches may be omitted. It is possible that the external terminals disposed at the extremities may be secured to the base plate at positions in the neighborhood of the four corners of the base plate. Furthermore, it is also possible that some of the external terminals may be secured to the base plate only at the four corners thereof.

As described above, in the hybrid circuit device according to the present invention, the flat package and base plate are superimposed upon each other, and the design is made such that circuit components can be securely mounted at positions where the flat package and base plate do not overlap. The integrated circuit of the flat package and the circuit provided on the base plate are connected together through the terminals of the flat package at the sides of the base plate and at the through-apertures thereof. At the above-mentioned positions where the flat package and base plate do not overlap, the circuit components, which may be relatively tall, are securely attached to the base plate at the same side as the flat package, and with such an arrangement, the thickness of the hybrid circuit device can be reduced. Furthermore, the external terminals are connected to the terminals of the flat package at that outer face of the flat package which is opposite to the base plate, that is, the connections between the external terminals and the terminals of the flat package are established at positions different from the positions where other terminals are connected. As a result, the connecting structures for the terminals are simplified so that short-circuiting can be prevented from occurring in the neighborhood of the sides of the base plate. When the external terminals are horizontally led out of the positions where those terminals are connected, a spacing that is substantially equal to the thickness of the flat package, is established between the base plate and the external terminals, and the circuit components constituting the circuit provided on the base plate, can be accommodated in that space. In this way, according to the present invention, the thickness of the DIP, which has conventionally been as large as 7 mm, is reduced down to a value that is as small as 4 mm; thus, the hybrid circuit device of the present invention can be constructed in a flat form.

Furthermore, with the arrangement that the external terminals disposed at the extremities are securely attached to the four corners of the base plate as shown in FIGS. 6 and 7, even if the various terminals are connected at positions asymmetrical and offset with respect to the base plate, the base plate will be firmly supported at the four corners thereof by the external terminals when the composite structure is encapsulated with plastics. Thus, it is possible to eliminate the possibility that there occur inferior products in which the base plate is inclined under the influence of the plastics during the encapsulating step and/or one or more of the connected terminals are disconnected.

While the present invention has been illustrated and described with respect to specific embodiments thereof, it is to be understood that the present invention is by no means limited thereto but encompasses all modifications and changes which will become possible within the scope of the appended claims.

We claim:

1. A hybrid circuit device comprising: a base plate on which a circuit including coils is provided, and a flat package of an integrated circuit having a smaller flat area than said base plate; said base plate and said flat package being superimposed upon each other; said two circuits being connected to each other through terminals of said flat package; external terminals being connected to at least one of said two circuits; said hybrid circuit device being encapsulated with plastics as a whole, with said external terminals being exposed outside the encapsulation; on that part of the base plate which does not overlap the flat package, circuit components constituting the circuit provided on said base plate being securely mounted at lateral positions with respect to said flat package; said terminals of said flat package being terminals which engage a marginal portion of said base plate and also terminals which are inserted in apertures formed through that part of said base plate which does not overlap said flat package; said external terminals including terminals bent at one end portion so as to extend along an outer surface of said flat package and being connected, on an outer face of the flat package opposite to said base plate, to terminals of said flat package extending along said outer surface of the flat package opposite to said base plate.

2. A hybrid circuit device according to claim 1 wherein said external terminals include terminals attached to said base plate at four corners thereof.

* * * * *